United States Patent
Lee et al.

(10) Patent No.: US 12,074,060 B2
(45) Date of Patent: Aug. 27, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Cheng-Chin Lee, Taipei (TW); Shao-Kuan Lee, Kaohsiung (TW); Kuang-Wei Yang, Hsinchu (TW); Cherng-Shiaw Tsai, New Taipei (TW); Hsin-Yen Huang, New Taipei (TW); Hsiaokang Chang, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 503 days.

(21) Appl. No.: 17/460,173

(22) Filed: Aug. 28, 2021

(65) Prior Publication Data
US 2023/0067027 A1 Mar. 2, 2023

(51) Int. Cl.
*H01L 21/768* (2006.01)
*H01L 23/522* (2006.01)
*H01L 23/532* (2006.01)

(52) U.S. Cl.
CPC .. *H01L 21/76837* (2013.01); *H01L 21/76802* (2013.01); *H01L 21/76831* (2013.01); *H01L 21/76832* (2013.01); *H01L 21/76885* (2013.01); *H01L 23/5226* (2013.01); *H01L 23/53295* (2013.01)

(58) Field of Classification Search
CPC ......... H01L 21/76837; H01L 21/76802; H01L 21/76831; H01L 21/76832; H01L 21/76885; H01L 23/5226; H01L 23/53295
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2021/0066187 A1* | 3/2021 | Lee ..................... H01L 23/5226 |

* cited by examiner

*Primary Examiner* — Marc Anthony Armand
(74) *Attorney, Agent, or Firm* — NZ CARR LAW OFFICE

(57) ABSTRACT

An interconnection structure, along with methods of forming such, are described. The structure includes a first conductive feature, a first liner having a first top surface disposed on the first conductive feature, a second conductive feature disposed adjacent the first conductive feature, and a second liner disposed on at least a portion of the second conductive feature. The second liner has a second top surface, and the first liner and the second liner each comprises a two-dimensional material. The structure further includes a first dielectric material disposed between the first and second conductive features and a dielectric layer disposed on the first dielectric material. The dielectric layer has a third top surface, and the first, second, and third top surfaces are substantially co-planar.

20 Claims, 14 Drawing Sheets

SEMICONDUCTOR DEVICE STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. With decreasing semiconductor device dimensions, improved semiconductor devices with reduced capacitance coupling is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
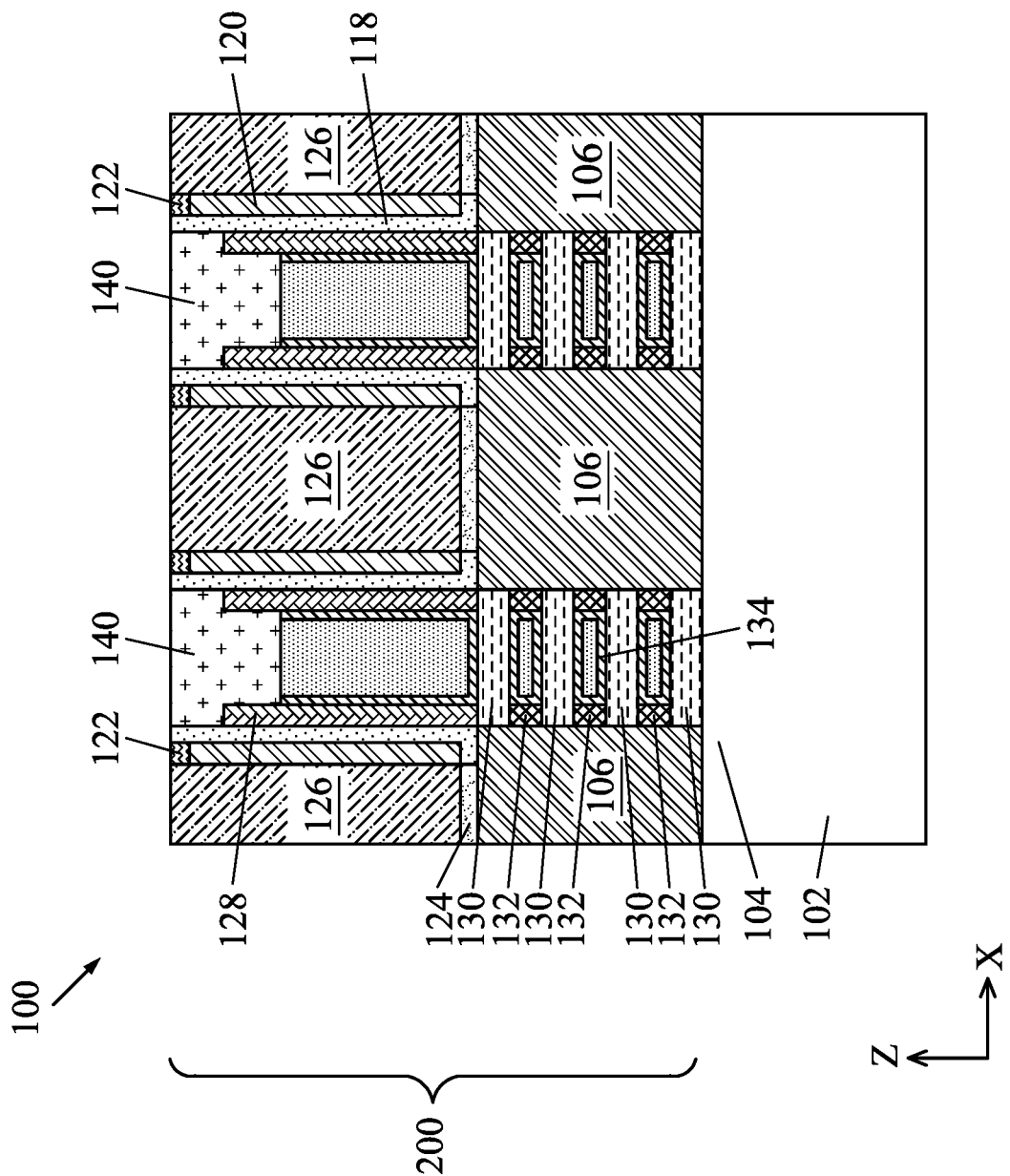
FIG. 1 is a cross-sectional side view of a stage of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a stage of manufacturing a semiconductor device structure 100. As shown in FIG. 1, the semiconductor device structure 100 includes a substrate 102 having substrate portions 104 extending therefrom and source/drain (S/D) epitaxial features 106 disposed over the substrate portions 104. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET). The S/D epitaxial features 106 may include a semiconductor material, such as Si or Ge, a III-V compound semiconductor, a II-VI compound semiconductor, or other suitable semiconductor material. Exemplary S/D epitaxial features 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D epitaxial features 106 may include p-type dopants, such as boron; n-type dopants, such as phosphorus or arsenic; and/or other suitable dopants including combinations thereof.

As shown in FIG. 1, S/D epitaxial features 106 may be connected by one or more semiconductor layers 130, which may be channels of a FET. In some embodiments, the FET is a nanostructure FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode layer 136 includes a metal. A gate dielectric layer 134 may be disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide (Ta$_2$O$_5$), yttrium oxide (Y$_2$O$_3$), silicon oxynitride (SiON), hafnium dioxide-alumina (HfO$_2$—Al$_2$O$_3$) alloy, or other suitable high-k materials.

The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. Spacers 128 may be disposed over the plurality of semiconductor layers 130. The spacers 128 may include a dielectric material such as silicon oxide, silicon nitride, silicon carbide, silicon oxynitride, SiCN, silicon oxycarbide, SiOCN, and/or combinations thereof. In some embodiments, a self-aligned contact (SAC) layer 140 is formed over the spacers 128, the gate dielectric layer 134, and the gate electrode layer 136, as shown in FIG. 1. The SAC layer 140 may include any suitable material such as SiO, SiN, SiC, SiON, SiOC, SiCN, SiOCN, AlO, AlON, ZrO, ZrN, or combinations thereof.

A contact etch stop layer (CESL) 118 and an interlayer dielectric (ILD) layer 120 are disposed over the S/D epitaxial features 106, as shown in FIG. 1. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be disposed on the ILD layer 120, and the cap layer 122 may include a nitrogen-containing material, such as SiCN.

Conductive contacts 126 may be disposed in the ILD layer 120 and over the S/D epitaxial features 106, as shown in FIG. 1. The conductive contacts 126 may include one or more electrically conductive material, such as Ru, Mo, Co, Ni. W, Ti, Ta, Cu, Al, TiN and TaN. Silicide layers 124 may be disposed between the conductive contacts 126 and the S/D epitaxial features 106.

As shown in FIG. 1, the semiconductor device structure 100 may include the substrate 102 and a device layer 200 disposed over the substrate 102. The device layer 200 may include one or more devices, such as transistors, diodes, imaging sensors, resistors, capacitors, inductors, memory cells, combinations thereof, and/or other suitable devices. In some embodiments, the device layer 200 includes transistors, such as nanostructure transistors having a plurality of channels wrapped around by the gate electrode layer, as described above. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. In some embodiments, the device layer 200 includes devices such as planar FET, FinFET, complementary FET (CFET), forksheet FET, or other suitable devices.

Figure 2:
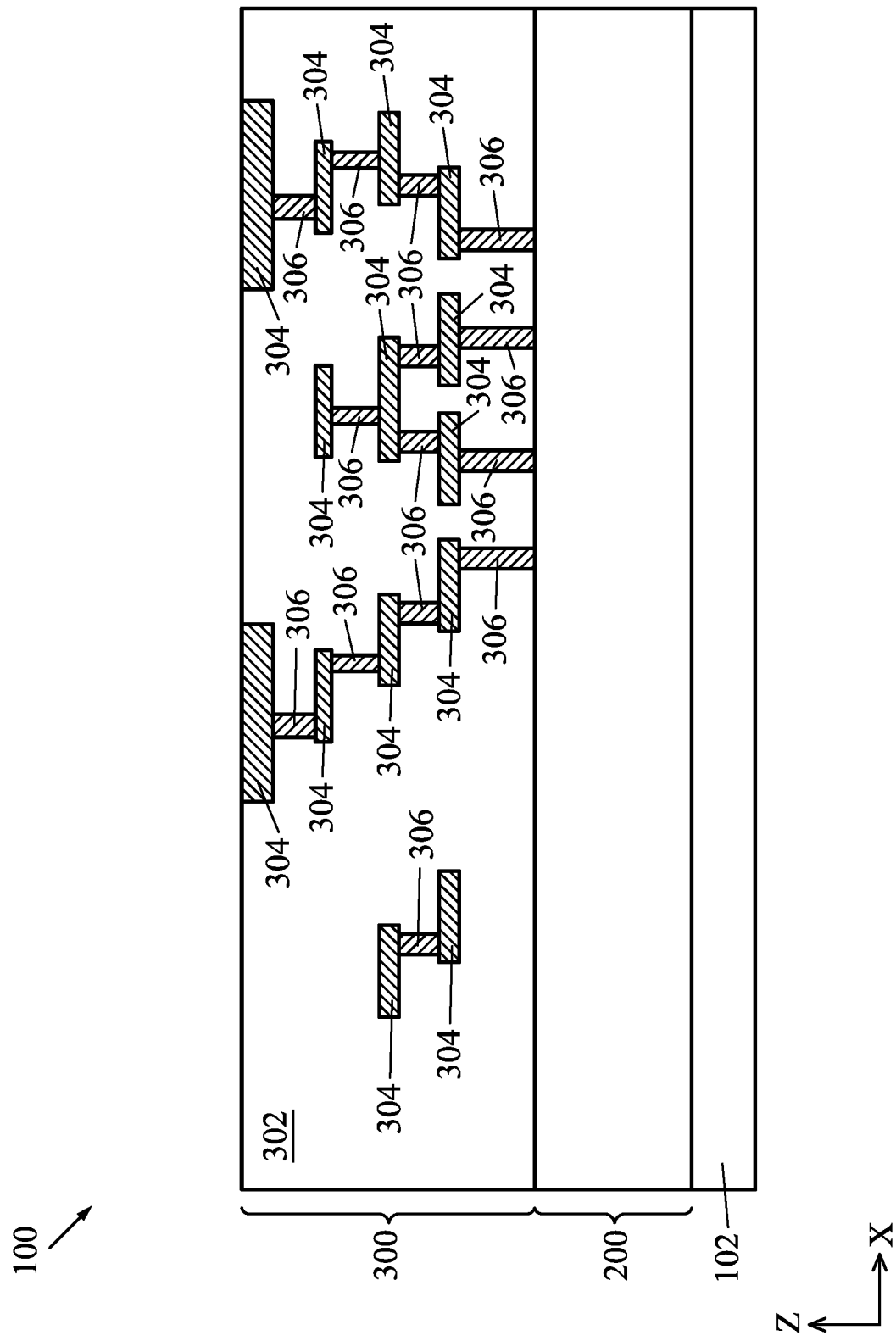
FIG. 2 is a cross-sectional side view of a stage of manufacturing the semiconductor device structure, in accordance with some embodiments.

The semiconductor device structure 100 may further include an interconnection structure 300 disposed over the device layer 200 and the substrate 102, as shown in FIG. 2. The interconnection structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnection structure 300 includes multiple levels of the conductive features 304, and the conductive features 304 are arranged in each level to provide electrical paths to various devices in the device layer 200 disposed below. The conductive features 306 provide vertical electrical routing from the device layer 200 to the conductive features 304 and between conductive features 304. For example, the bottom-most conductive features 306 of the interconnection structure 300 may be electrically connected to the conductive contacts 126 (FIG. 1) and the gate electrode layer 136 (FIG. 1). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as SiO$_x$, SiO$_x$C$_y$H$_z$, or SiO$_x$C$_y$, where x, y and z are integers or non-integers. In some embodiments, the IMD layer 302 includes a low-k dielectric material having a k value less than that of silicon oxide.

Figure 3A:
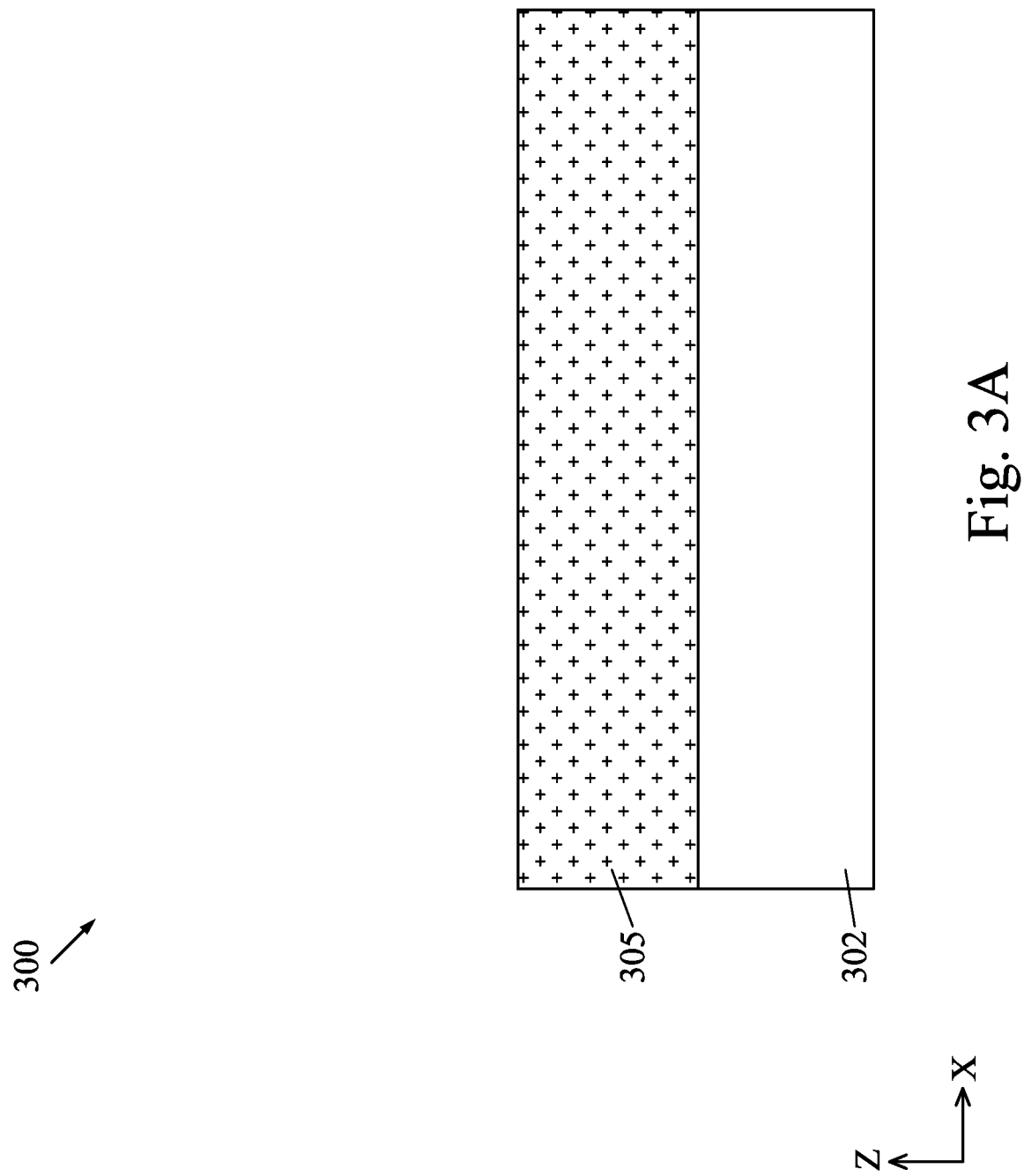
FIGS. 3A-3H are cross-sectional side views of various stages of manufacturing the interconnection structure, in accordance with some embodiments.

FIGS. 3A-3H are cross-sectional side views of various stages of manufacturing the interconnection structure 300, in accordance with some embodiments. As shown in FIG. 3A, the interconnection structure 300 includes a dielectric layer 301, which may be an ILD layer or an IMD layer. For example, the dielectric layer 301 may be SiCOH and has a k value ranging from about 2.5 to about 3. In some embodiments, the dielectric layer 301 may be disposed over the ILD layer 120 (FIG. 1). The dielectric layer 301 may include one or more conductive features (not shown) disposed therein. The one or more conductive features may be electrically connected to the S/D epitaxial features 106 (FIG. 1) and the gate electrode layer 136 (FIG. 1). In some embodiments, the conductive features are the conductive features 304 or conductive features 306 shown in FIG. 2. The dielectric layer 301 may include an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of the silicon oxide); a carbon-containing material, such as SiC, SiOC, or any suitable dielectric material. The dielectric layer 301 may be formed by chemical vapor deposition (CVD), atomic layer deposition (ALD), spin-on, physical vapor deposition (PVD) or other suitable process.

As shown in FIG. 3A, a conductive layer 305 is formed over the dielectric layer 301. In some embodiments, a glue layer (not shown) is formed on the dielectric layer 301 and the conductive layer 305 is formed on the glue layer. The glue layer may include Si, SiO, SiN, SiCN, SiON, SiOC, one or more metal nitrides, one or more metals, or other suitable material that can provide adhesion between the conductive layer 305 and the dielectric layer 301 along with the conductive features (not shown) formed therein. The conductive layer 305 may include an electrically conductive material, such as Cu, Co, Ru, Mo, Cr, W, Mn, Rh, Ir, Ni, Pd, Pt, Ag, Au, Al, Ta, FeCo, FeAl, alloys thereof, combinations thereof, or other suitable material. In some embodiments, the conductive layer 305 includes one or more metals. The conductive layer 305 may be formed by any suitable process, such as PVD, CVD, electroplating, or ALD.

Figure 3B:
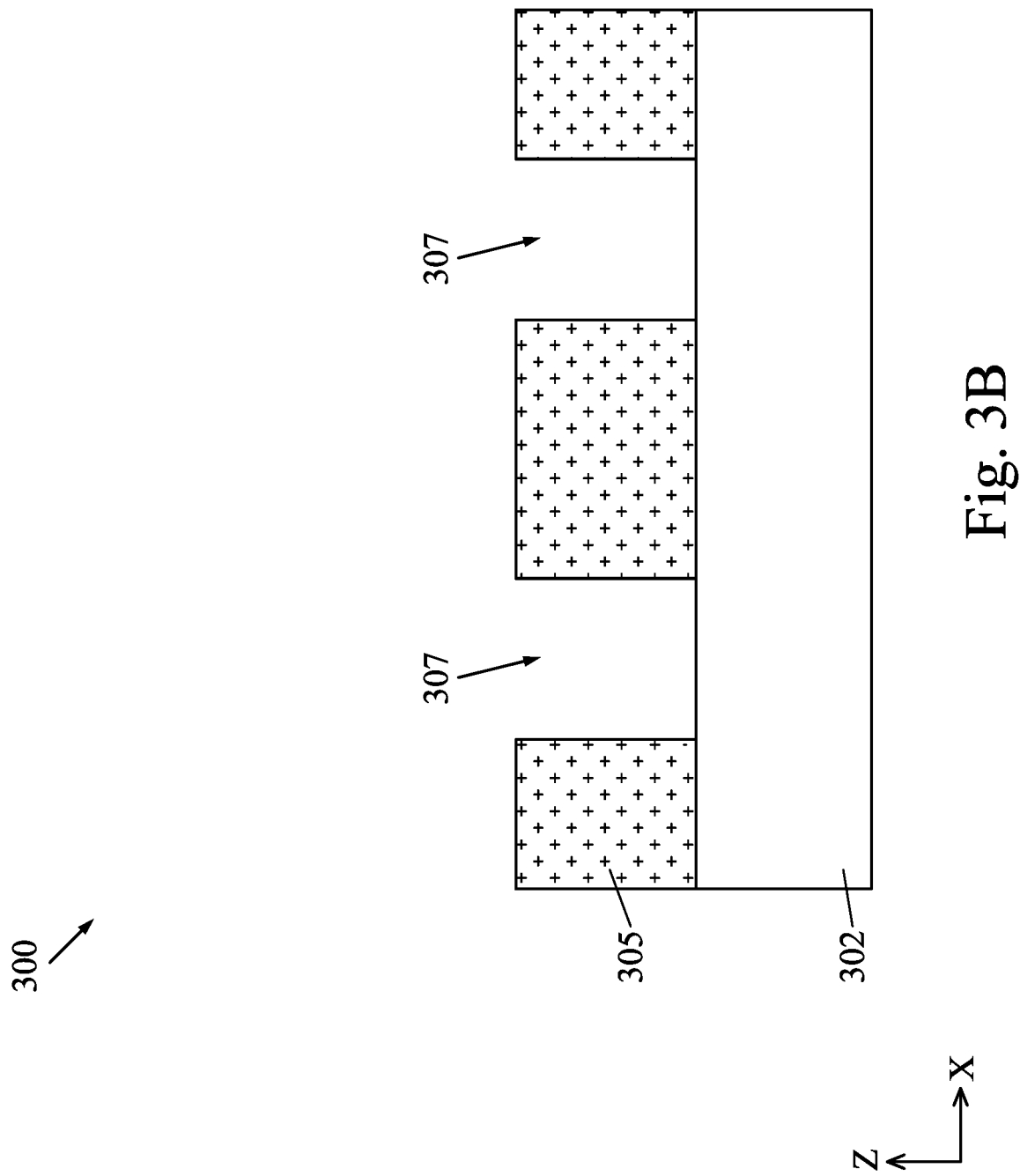

As shown in FIG. 3B, one or more openings 307 are formed in the conductive layer 305. In some embodiments, a mask (not shown) may be formed on the conductive layer 305 before forming the one or more openings 307. The mask may be patterned, and the pattern may be transferred from the mask to the conductive layer 305 to form the one or more openings 307. The openings 307 separate the conductive layer 305 into one or more portions, such as a plurality of portions. In some embodiments, each portion of the conductive layer 305 is a conductive feature, such as a conductive line. For example, each portion of the conductive layer 305 may be the conductive feature 304 shown in FIG. 2.

The one or more openings 307 in the conductive layer 305 may be formed by one or more etch process, such as dry etch, wet etch, or a combination thereof. For example, a dry etch process, such as reactive ion etching (RIE) process, may be performed to form the one or more openings 307. The RIE process may be an ion-beam etching (IBE) with IBE power ranging from about 100 V to about 2000 V, beam angle ranging from about 0 degrees to about 70 degrees, and in the presence of one or more gases, such as He, Ne, Ar, Kr, or Xe. The beam angle may be between the beam direction and the Z direction. The RIE process may be an inductive coupled plasma (ICP) RIE having a power ranging from about 100 W to about 2000 W, such as from about 100 W to about 1500 W, a bias voltage ranging from about 0 V to about 500 V, such as from about 0 V to about 300 V, and in the presence of one or more gases, such as $CH_3COOH$, $CH_3OH$, $CH_3CH_2OH$, $CF_4$, $CHF_3$, $CH_2F_2$, $C_4F_8$, $C_4F_6$, $N_2$, $O_2$, Ar, $Cl_2$, $SiCl_4$, $BCl_3$, or other suitable organic gas.

In some embodiments, a wet etch process may be performed to form the one or more openings 307. The wet etch may include a wet clean component and an inhibitor component. The wet clean component may include tolunitrile, 4-methyl-3-nitrobenzonitrile, 4-(bromomethyl)benzonitrile, 4-(chloromethyl)benzonitrile, 2-fluoro-4-(trifluoromethyl)benzonitrile, 4-(trifluoromethyl)benzonitrile, diethylene glycol monobutyl ether, 2-(2-butoxyethoxy)ethyl acetate, diethylene glycol dimethyl ether, dimethyl sulfoxide, dimethylformamide, poly(ethylene glycol)bis(amine), (2-methylbutyl)amine, tris(2-ethylhexyl)amine, (4-isothiocyanatophenyl)(3-methylphenyl)amine, poly(ethylene glycol) methyl ether amine, poly(ethylene glycol)diamine, triethanolamine hydrochloride, triethanolamine, trolamine, trolamine salicylate, 2-chloroethyl vinyl ether, 2-[4-(dimethylamino)phenyl]ethanol, tetraethylethylenediamine, ammonium acetate, ammonium chloride, ammonium sulfate, ammonium formate, ammonium nitrate, ammonium carbonate, ammonium fluoride, ammonium persulphate, ammonium sulfamate, ammonium phosphate, 1-acetylguanidine, any suitable acid, or other suitable wet clean component. The inhibitor component may include 1-chlorobenzotriazole, 5-chlorobenzotriazole, 5-methyl-1H-benzotriazole, 1-methyl-1H-1,2,3-benzotriazole-5-carbaldehyde, 1-methyl-1H-1,2,3-benzotriazol-5-amine, 1-methylimidazole, 2-mercapto-1-methylimidazole, 1-methylimidazole-2-sulfonyl chloride, 5-chloro-1-methylimidazole, 5-iodo-1-methylimidazole, thiamazole, 1-methylimidazolium chloride, 2,5-dibromo-1-methyl-1H-imidazole, 1H-benzotriazole-4-sulfonic acid, benzotriazole (BTA), BTA-like material, or other suitable inhibitor component.

Figure 3C:
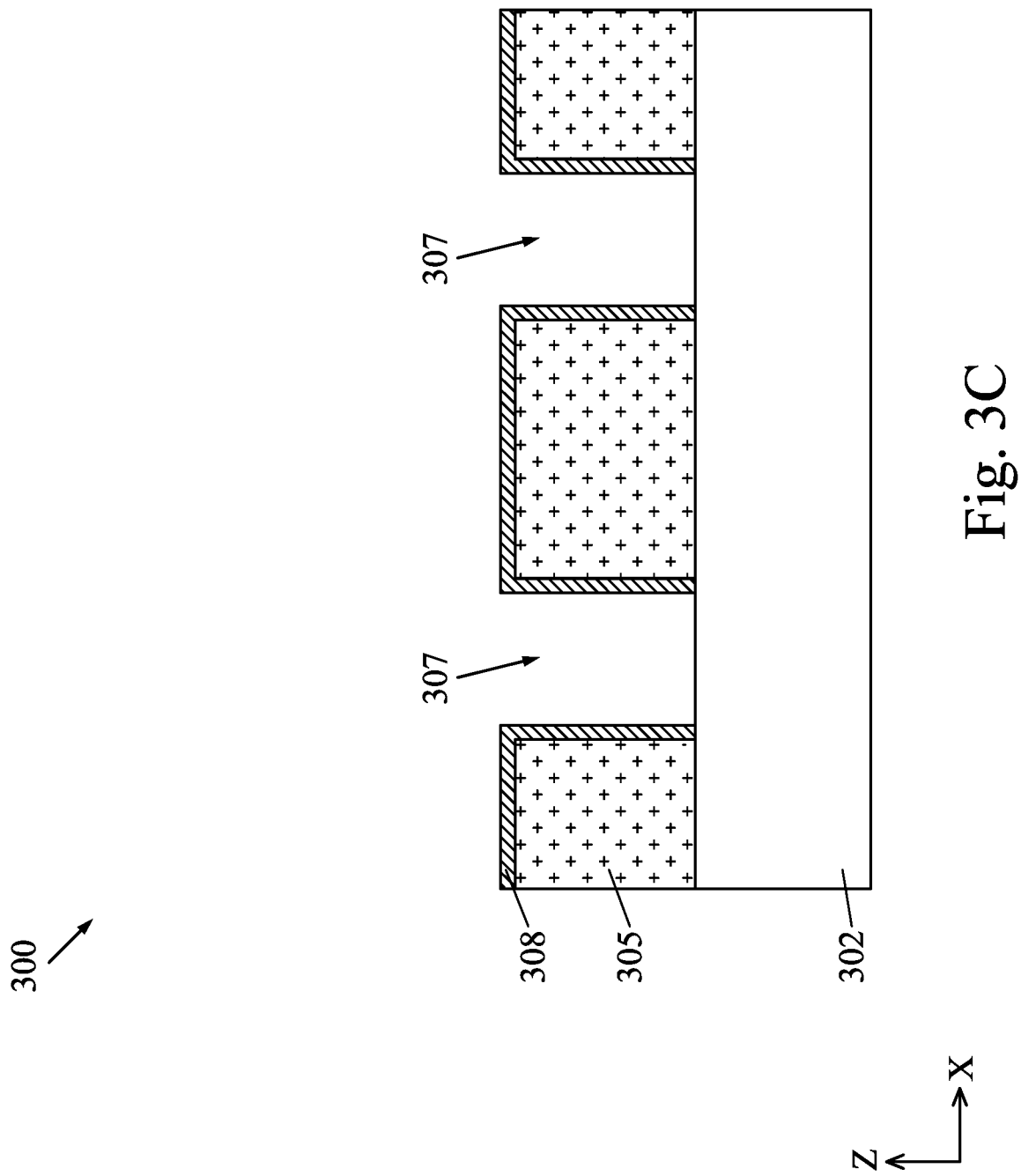

As shown in FIG. 3C, a liner 308 is selectively formed on each portion of the conductive layer 305. The liner 308 may include a two-dimensional (2D) material. The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to Hf, $Te_2$, $WS_2$, $MoS_2$, $WSe_2$, $MoSe_2$, or any combination thereof. The 2D material of the liner 308 may function as a blocking layer and a circuit thermal spreading layer due to the characteristics of the 2D material.

The liner 308 may be selectively formed on each portion of the conductive layer 305. For example, the formation of the liner 308 is a metal-catalyzed process. Thus, the liner 308 is formed on the metallic surfaces of each portion of the conductive layer 305 but not on the dielectric surfaces of the dielectric layer 301. The liner 308 may be formed by any suitable process, such as CVD. In some embodiments, the liner 308 has a thickness ranging from about 30 Angstroms to about 50 Angstroms. If the thickness of the liner 308 is less than about 30 Angstroms, the liner 308 may not be sufficient to block subsequently formed dielectric material 310 (FIG. 3D) and dielectric layer 312 (FIG. 3E) from forming on the conductive layer 305 and/or to function as a circuit thermal spreading layer. On the other hand, if the thickness of the liner 308 is greater than about 50 Angstroms, manufacturing cost may be increased without significant advantage.

Figure 3D:
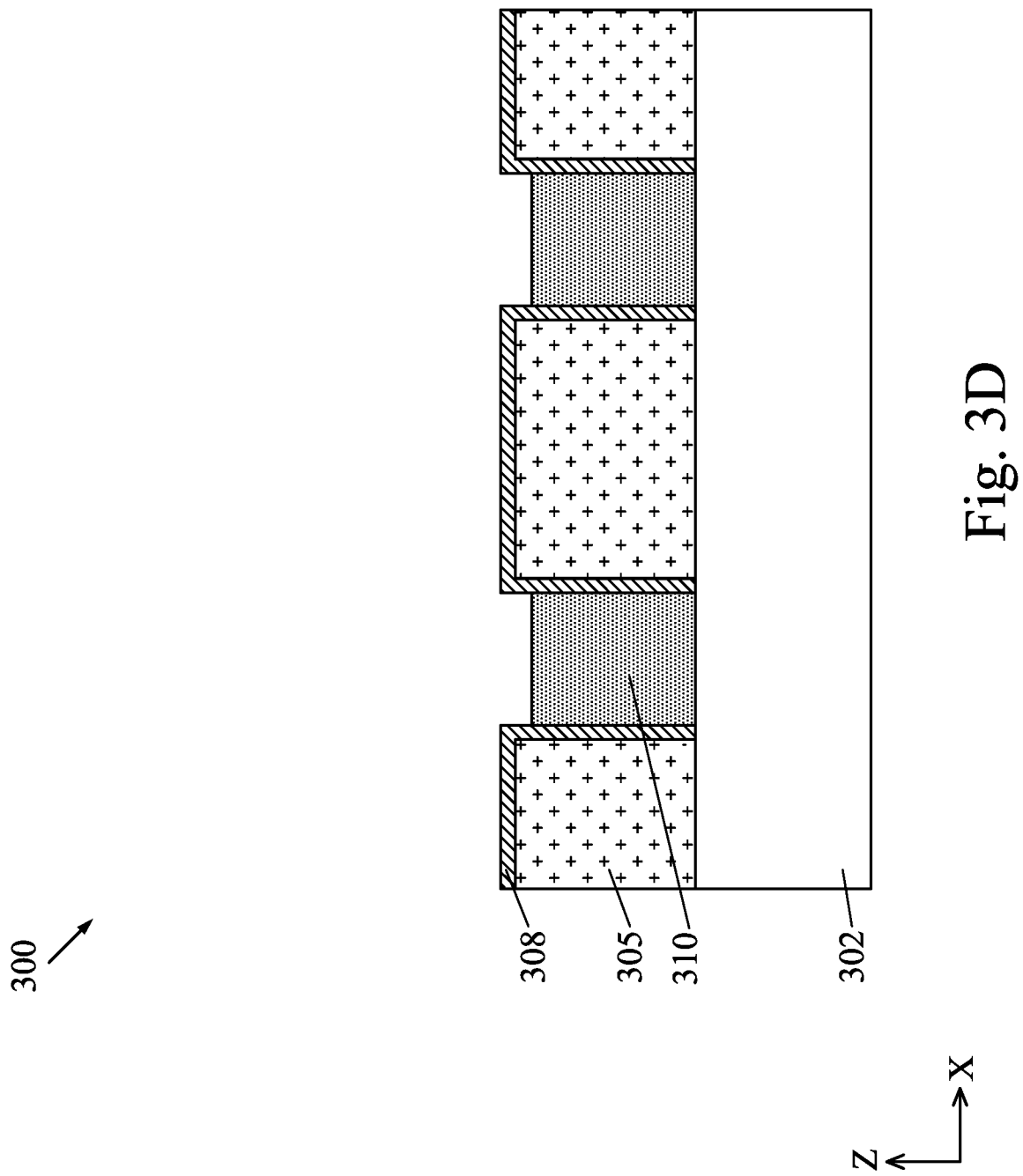

As shown in FIG. 3D, a dielectric material 310 is formed over the dielectric layer 301 in each opening 307. The dielectric material 310 may include the same material as the dielectric layer 301. The dielectric material 310 may be formed by any suitable process. In some embodiments, the dielectric material 310 is formed by thermal soaking in a bottom-up fashion. For example, one or more precursors, such as silicon-containing precursor and oxygen-containing precursor, may react on the dielectric surfaces of the dielectric layer 301 to form the dielectric material 310. The liner 308, which is made of a 2D material, does not provide reactive sites for the precursors to form the dielectric material 310. As a result, the dielectric material 310 is not substantially formed on the liner 308. The dielectric material 310 may be in contact with the portion of the liner 308 formed on the vertical surfaces of the portion of the conductive layer 305 as a result of bottom-up formation from the dielectric layer 301. The dielectric material 310 is not formed on the portion of the liner 308 formed on the horizontal surfaces of the portion of the conductive layer 305.

The thickness of the dielectric material 310 along the Z direction may be about 30 Angstroms to about 50 Angstroms less than the combined thickness of the conductive layer 305 and the liner 308. By forming the dielectric material 310 in a bottom-up fashion, the control of the thickness of the dielectric material 310 may be improved. In addition, the number of processes, such as a planarization process followed by an etch back process, may be reduced as a result of the bottom-up formation of the dielectric material 310.

Figure 3E:
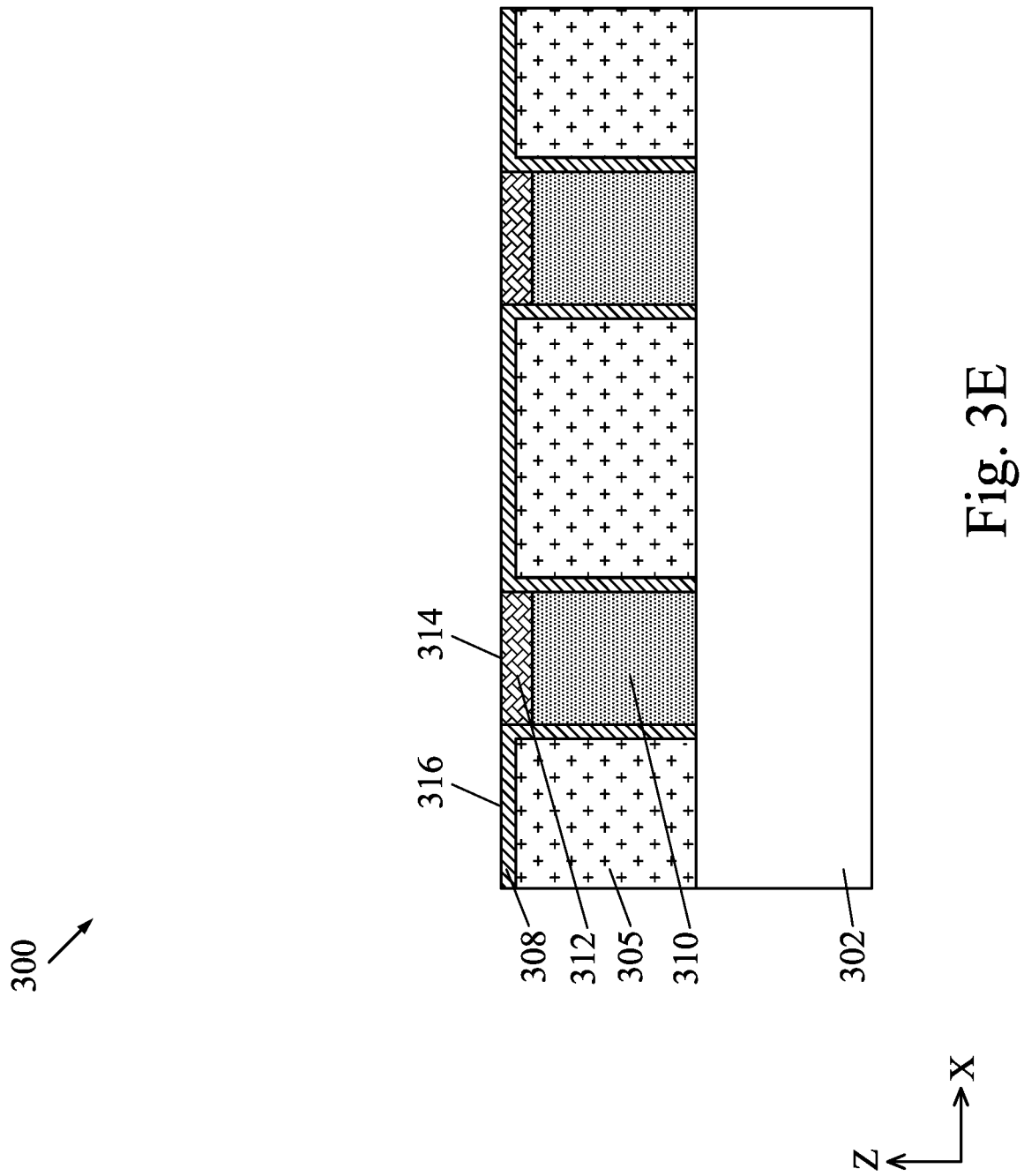

As shown in FIG. 3E, dielectric layers 312 are selectively formed on the dielectric material 310 in the openings 307 (FIG. 3C). In some embodiments, the dielectric layer 312 is formed on the dielectric material 310 but not on the liner 308 by a thermal ALD process at a temperature ranging from about 150 degrees Celsius to about 350 degrees Celsius. The 2D material of the liner 308 prevents the precursors of the dielectric layer 312 from adsorbing thereon. Each dielectric layer 312 may be formed between adjacent portions of the conductive layer 305. The dielectric layer 312 may include a silicon-based material, such as $Si_xO_y$, $SiO_yN_x$, $Si_xO_yC_z$, a metal oxide, such as $AlO_x$, or a metal nitride, such as $AlN_x$, $HfN_x$, where x, y, and z may be integers or non-integers. The material of the dielectric layer 312 may be different from an etch stop layer 318 (FIG. 3F) formed subsequently, so the dielectric layer 312 may have an etch rate substantially slower than an etch rate of the etch stop layer 318 during an etch process. In some embodiments, the dielectric layer 312 has a k value greater than the k value of the dielectric material 310.

The dielectric layer 312 may have a thickness ranging from about 5 Angstroms to about 100 Angstroms. In some embodiments, the thickness of the dielectric layer 312 ranges from about 30 Angstroms to about 50 Angstroms, and a top surface 314 of the dielectric layer 312 may be substantially co-planar with a top surface 316 of the portion of the liner 308 formed on the horizontal surface of the portion of the conductive layer 305, as shown in FIG. 3E. The dielectric layers 312 prevent a subsequently formed conductive feature 322 (FIG. 3H) from entering between the adjacent portions of the conductive layer 305 as a result of overlay shift. Thus, if the thickness of the dielectric layer 312 is less than about 30 Angstroms, the dielectric layer 312 may not be sufficient to prevent the conductive feature 322 (FIG. 3H) from entering between the adjacent portions of the conductive layer 305. On the other hand, if the thickness of the dielectric layer 312 is greater than about 50 Angstroms, manufacturing cost may be increased without significant advantage. In addition, the top surface 314 of the dielectric layer 312 and the top surface 316 of the liner 308 being co-planar may lead to improved yield percent.

Figure 3F:
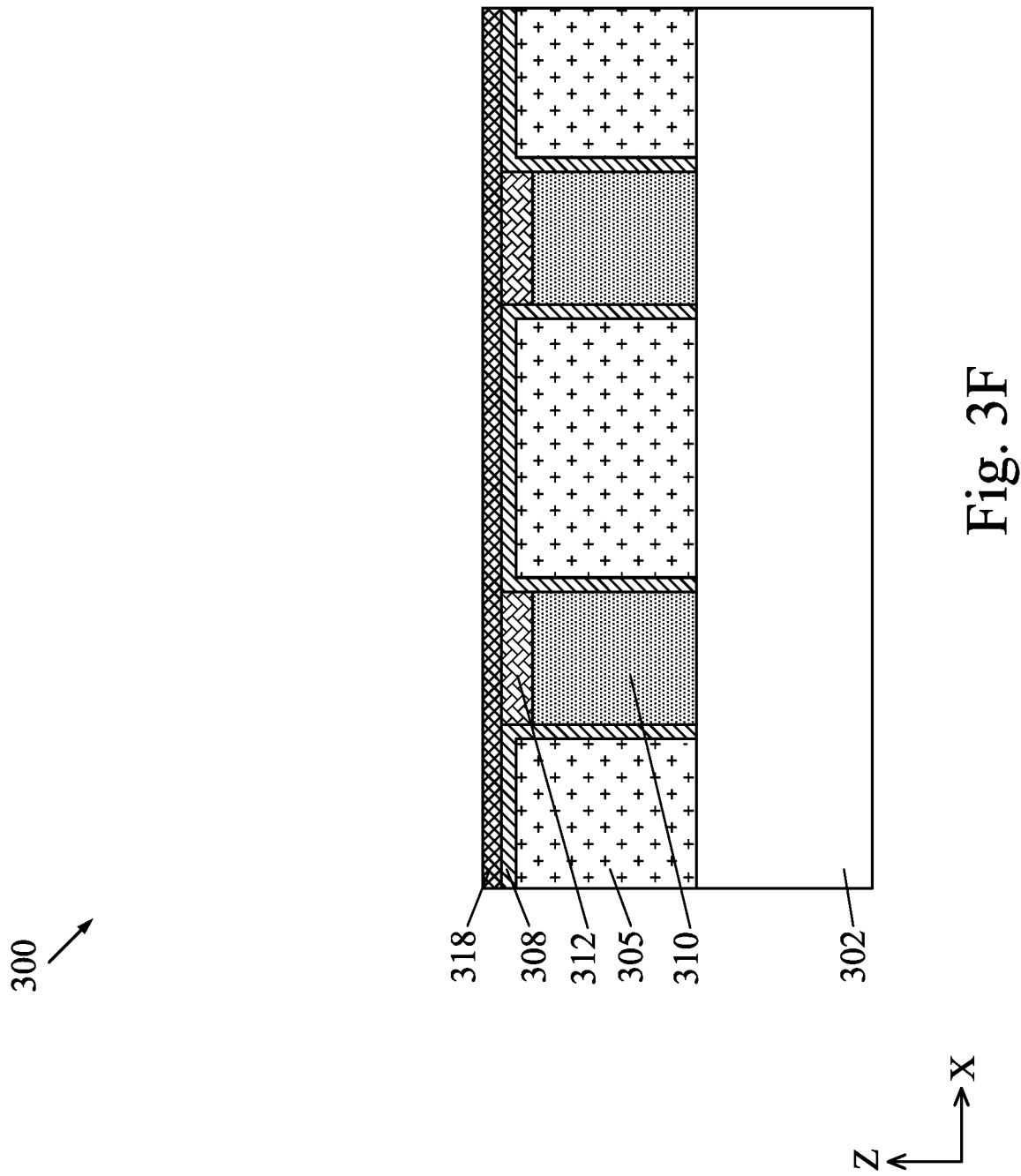

As shown in FIG. 3F, an etch stop layer 318 is formed on the co-planar top surfaces 314, 316 of the dielectric layers 312 and the liners 308, respectively. The etch stop layer 318 may be made of a material having different etch selectivity compared to the dielectric layers 312. In some embodiments, the etch stop layer 318 is made of a material including a metal, such as a metal oxide. For example, the etch stop layer 318 is a metal oxide and may include Al, Hf, Zr, Y, or other suitable metal. In some embodiments, the etch stop layer 318 is made of aluminum oxide or zirconium oxide. The etch stop layer 318 may be formed by any suitable process, such as CVD, ALD, PVD, PEALD, or PECVD. The etch stop layer 318 may have a thickness ranging from about 5 Angstroms to about 50 Angstroms.

Figure 3G:
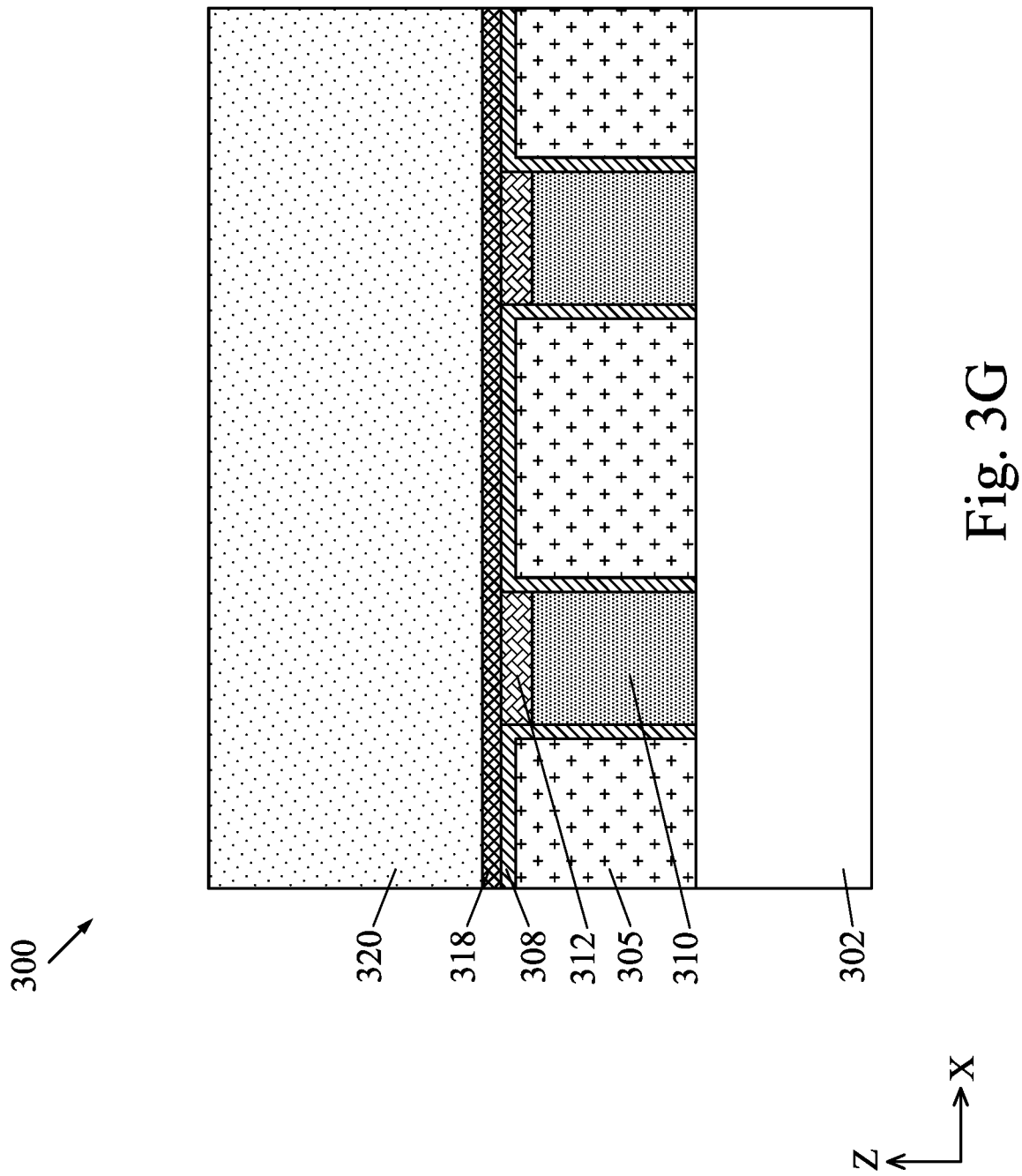

As shown in FIG. 3G, a dielectric material 320 may be formed on the etch stop layer 318. The dielectric material 320 may include the same material as the dielectric material 310. In some embodiments, the dielectric material 320 includes a low-k dielectric material, such as $SiC_xO_yH_z$, where x, y, and z are integers or non-integers. The dielectric material 320 may be formed by any suitable process, such as PVD, ALD, CVD, PEALD, or PECVD, and may have a thickness ranging from about 200 Angstroms to about 500 Angstroms. In some embodiments, the dielectric material 320 is formed by ALD, and the etch stop layer 318 may increase the deposition rate of the dielectric material 320 by ALD.

Figure 3H:
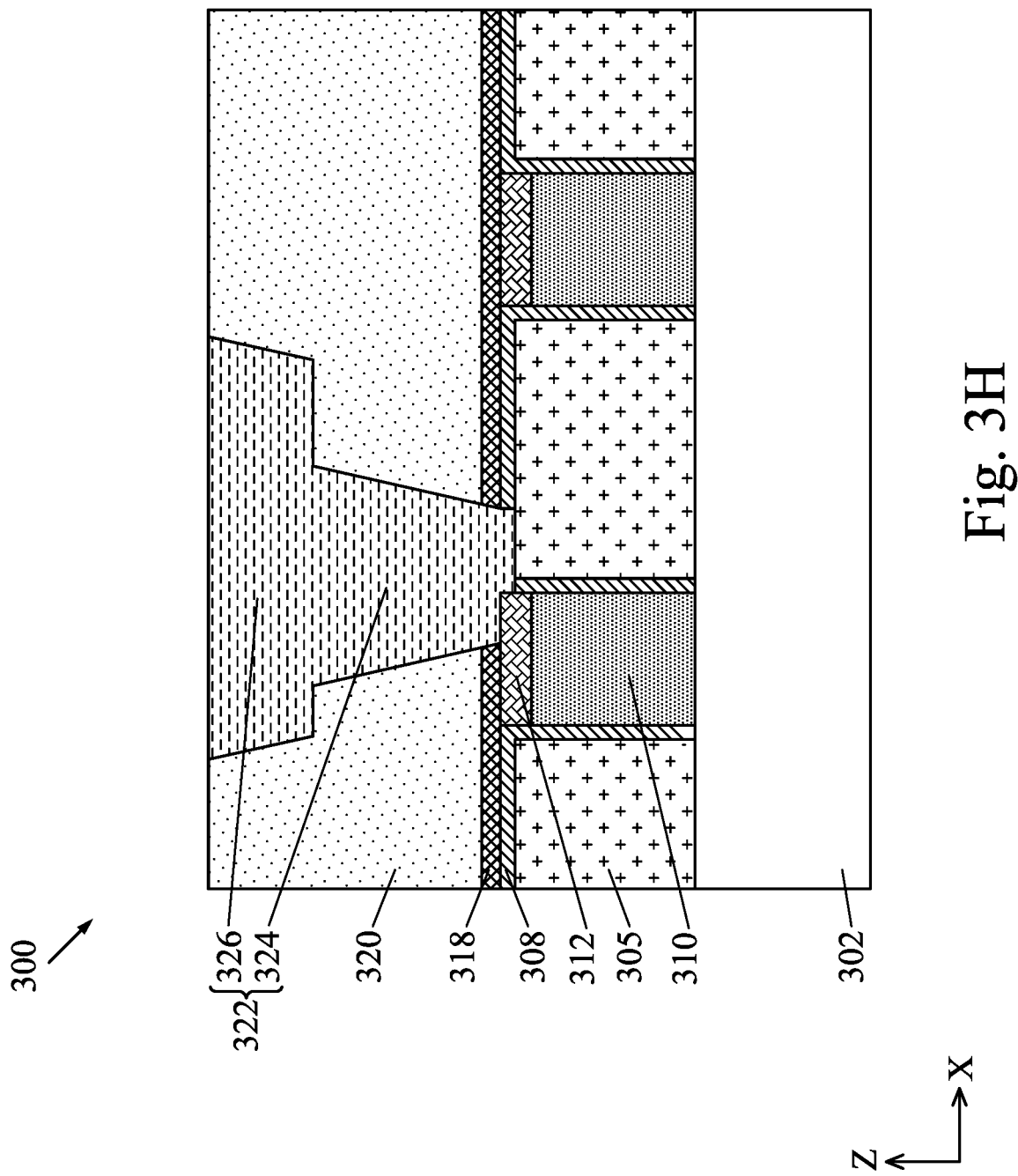

As shown in FIG. 3H, one or more conductive features 322 are formed in the dielectric material 320. The conductive feature 322 may include a barrier layer (not shown) may be formed between each conductive feature 322 and the dielectric material 320. The conductive feature 322 may include a first portion 324 disposed in a first opening in the dielectric material 320 and a second portion 326 disposed in a second opening located above the first opening. The first and second openings may be a result of a dual-damascene process. For example, the second opening may be first formed by patterning a hard mask (not shown) disposed on the dielectric material 320 and transferring the pattern to a portion of the dielectric material 320. The first opening is then formed by covering a portion of a bottom of the second opening. Thus, the first opening has smaller dimensions than the second opening. In some embodiments, the first opening is formed before the second opening. In some embodiments, the first opening is a via and the second opening is a trench. The first and second openings in the dielectric material 320 may be formed by any suitable processes, such as one or more etch processes. In some embodiments, the one or more etch processes includes a dry etch process and a wet etch process. The etch processes also remove a portion of the etch stop layer 318. In some embodiments, the first opening is slightly misaligned with the portion of the conductive layer 305 as a result of overlay shift, and a portion of the liner 308 and a portion of the dielectric layer 312 are exposed. In some embodiments, the exposed portion of the liner 308 may be removed by a plasma treatment, and a portion of the conductive layer 305 is exposed.

As shown in FIG. 3H, the first portion 324 of the conductive feature 322 is formed on a portion of the dielectric layer 312. If the dielectric layers 312 are not present, the etch process to remove a portion of the etch stop layer 318 may also remove a portion of the dielectric material 310 disposed between adjacent portions of the conductive layer 305. As a result, subsequently formed conductive feature may be formed in the dielectric material 310 between the adjacent portions of the conductive layer 305, which may cause line to line leakage. Reliability issues such as poor breakdown voltage or time dependent dielectric breakdown may occur as a result of the line to line leakage. Capacitance coupling may be also increased as a result. With the dielectric layers 312 disposed on the dielectric material 310, the etch process utilized to remove the portion of the etch stop layer 318 does not substantially affect the dielectric layers 312 due to the substantially different etch selectivity compared to the etch stop layer 318. Thus, with the dielectric layers 312, the risk of line to line leakage is reduced when there is an overlay shift issue, and capacitance coupling is reduced. As shown in FIG. 3H, the conductive feature 322 formed in the etch stop layer 318 is disposed over the dielectric layer 312 and not between adjacent portions of the conductive layer 305.

Figure 4A:
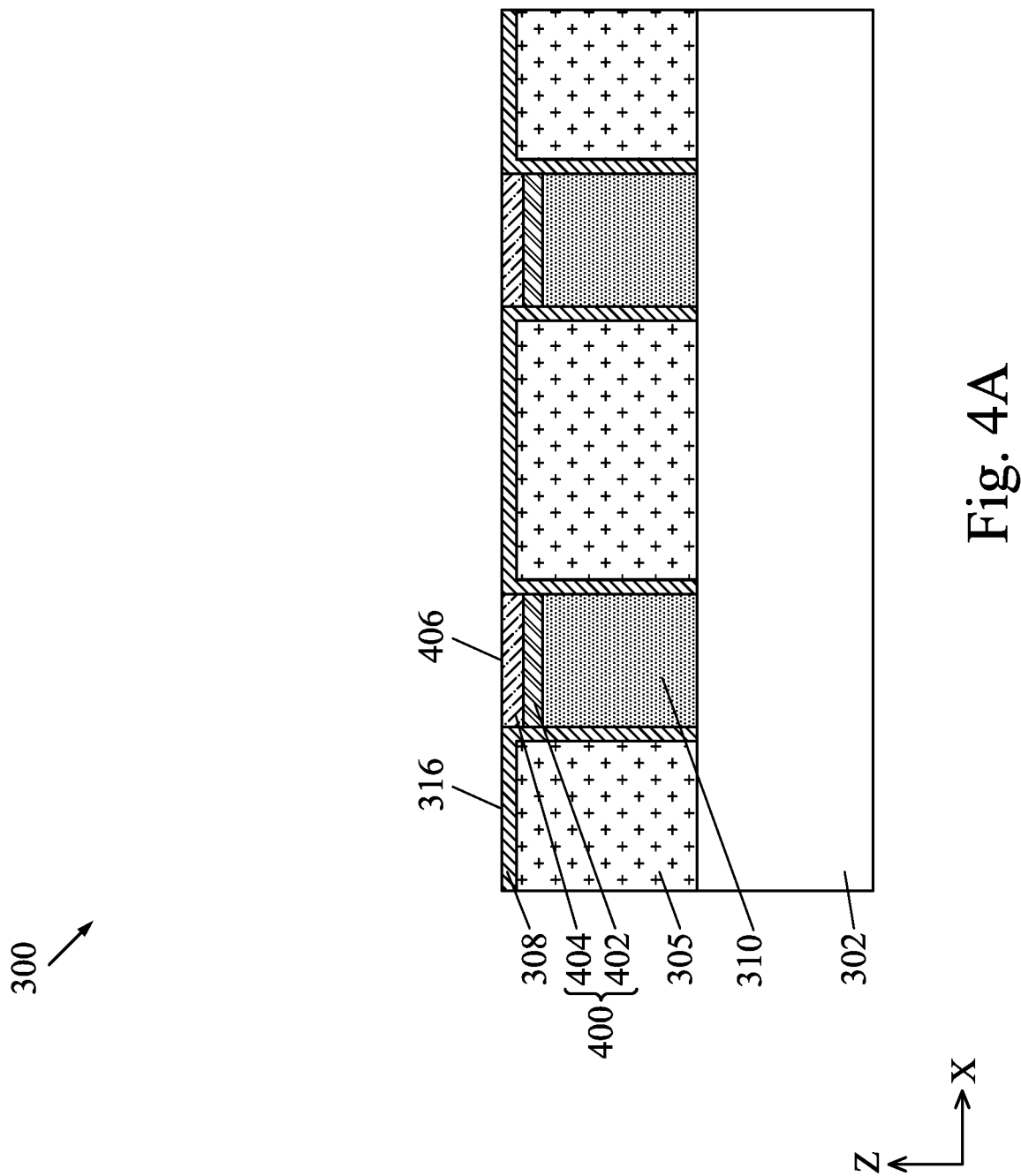
FIGS. 4A-4D are cross-sectional side views of various stages of manufacturing the interconnection structure, in accordance with alternative embodiments.

FIGS. 4A-4D are cross-sectional side views of various stages of manufacturing the interconnection structure 300, in accordance with alternative embodiments. In some embodiments, after forming the dielectric material 310, dielectric structures 400 are formed on the exposed dielectric material 310 between adjacent portions of the conductive layer 305, as shown in FIG. 4A. The dielectric structure 400 includes a first dielectric layer 402 and a second dielectric layer 404 disposed on the first dielectric layer 402. The first and second dielectric layers 402, 404 may be formed by the same process as the dielectric layer 312. Similar to the formation of the dielectric layer 312 described above, the precursors used to form the first and second dielectric layers 402, 404 do not form on the liner 308. Thus, the dielectric structure 400 may be selectively formed on the dielectric material 310 and not on the liner 308. The second dielectric layer 404 may have an increased etch selectivity against the etch stop layer 318 (FIG. 4B) compared to the first dielectric layer 402, and the first dielectric layer 402 may have a lower k value than the second dielectric layer 404. For example, the first dielectric layer 402 may include a first dielectric material having a first k value that is substantially equal to or greater than the k value of the dielectric material 310, and the second dielectric layer 404 may include a second dielectric material having a second k value that is greater than the first k value. The second dielectric layer 404 has a slower etch rate by the etchant used to remove the portion of the etch stop layer 318 (FIG. 4B) than the etch rate of the first dielectric layer 402. The lower k value of the first dielectric layer 402 helps reducing parasitic capacitance. In some embodiments, the first dielectric layer 402 includes a metal oxide or silicon oxide, and the second dielectric layer 404 includes a different metal oxide or a metal nitride. A top surface 406 of the second dielectric layer 404 may be substantially co-planar with the top surface 316 of the liner 308, as shown in FIG. 4A.

The dielectric structure 400 may have a total thickness along the Z direction ranging from about 30 Angstroms to about 50 Angstroms. The thickness of the second dielectric layer 404 may be about 15 percent to about 85 percent of the total thickness of the dielectric structure 400. The second dielectric layer 404 may have a higher k value and a slower etch rate in an etch process to remove a portion of the etch stop layer 318 (FIG. 4B) compared to the first dielectric layer 402. Thus, if the thickness of the second dielectric layer 404 is less than about 15 percent of the total thickness of the dielectric structure 400, the second dielectric layer 404 may be removed during the removal of a portion of the etch stop layer 318 (FIG. 4B), and the conductive feature 322 (FIG. 4D) may be formed between adjacent portions of the conductive layer 305. On the other hand, if the thickness of the second dielectric layer 404 is greater than about 85 percent of the total thickness of the dielectric structure 400, the overall k value of the dielectric material between adjacent portions of the conductive layer 305 may be unnecessarily increased.

Figure 4B:
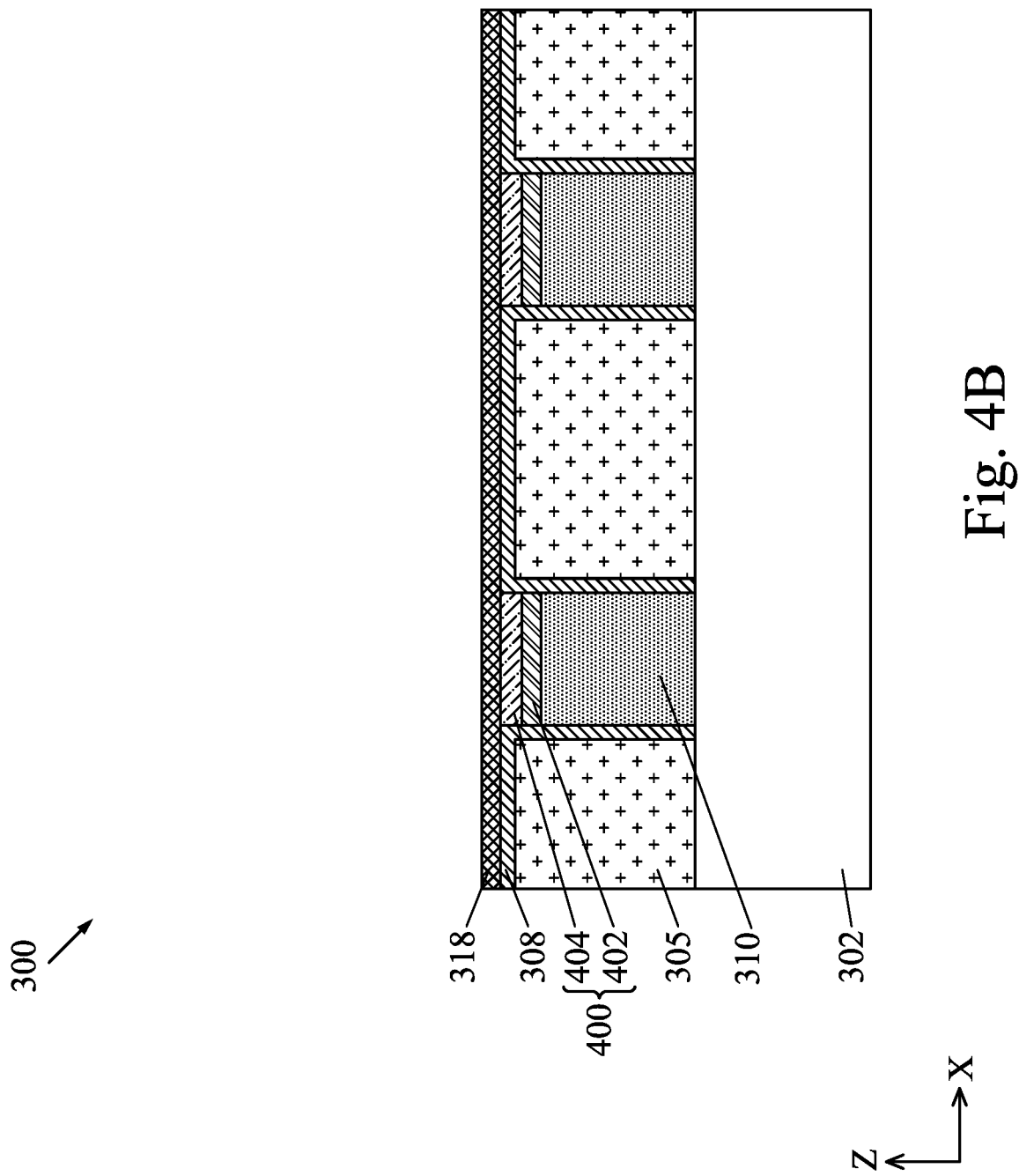
Figure 4C:
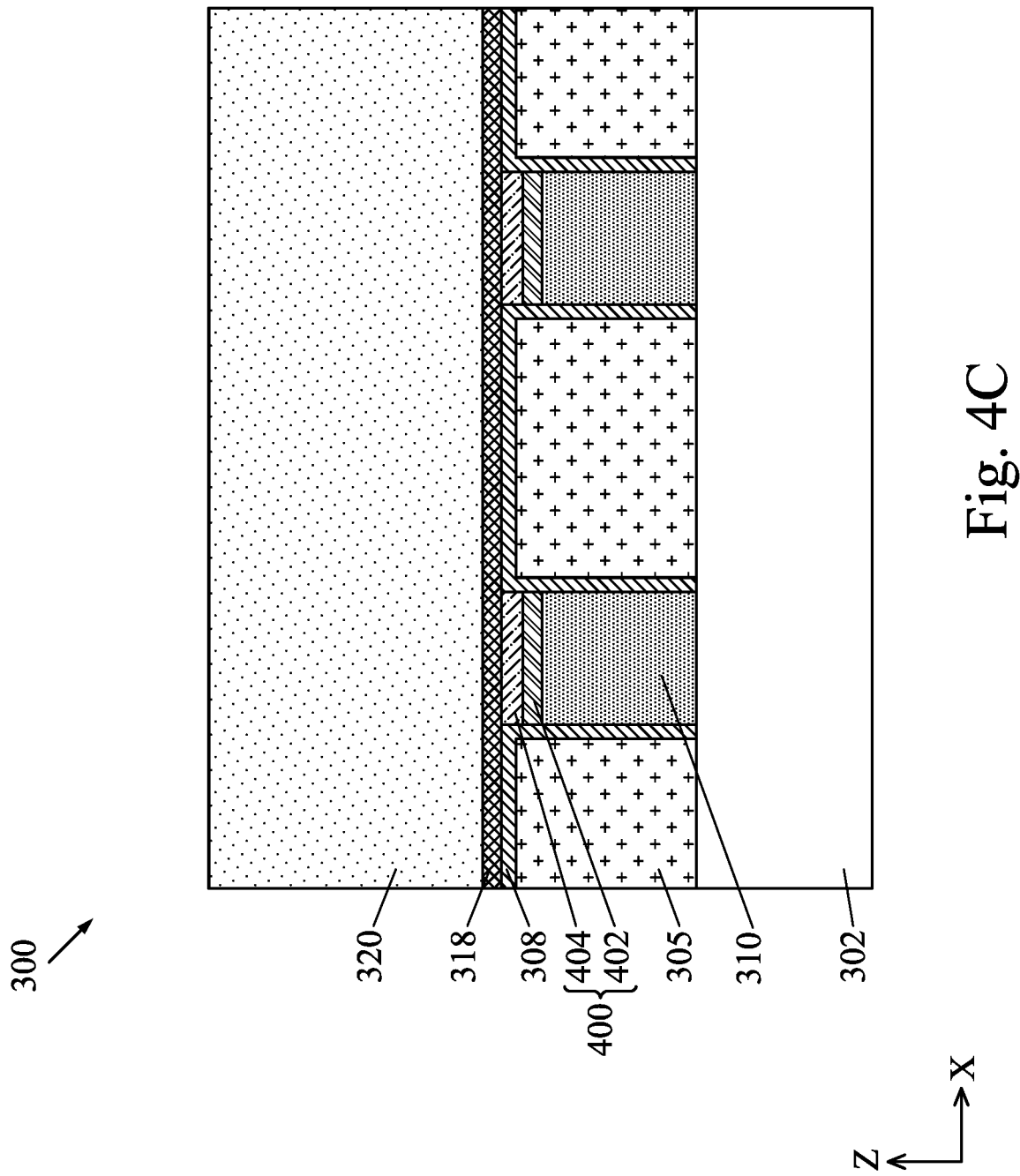
Figure 4D:
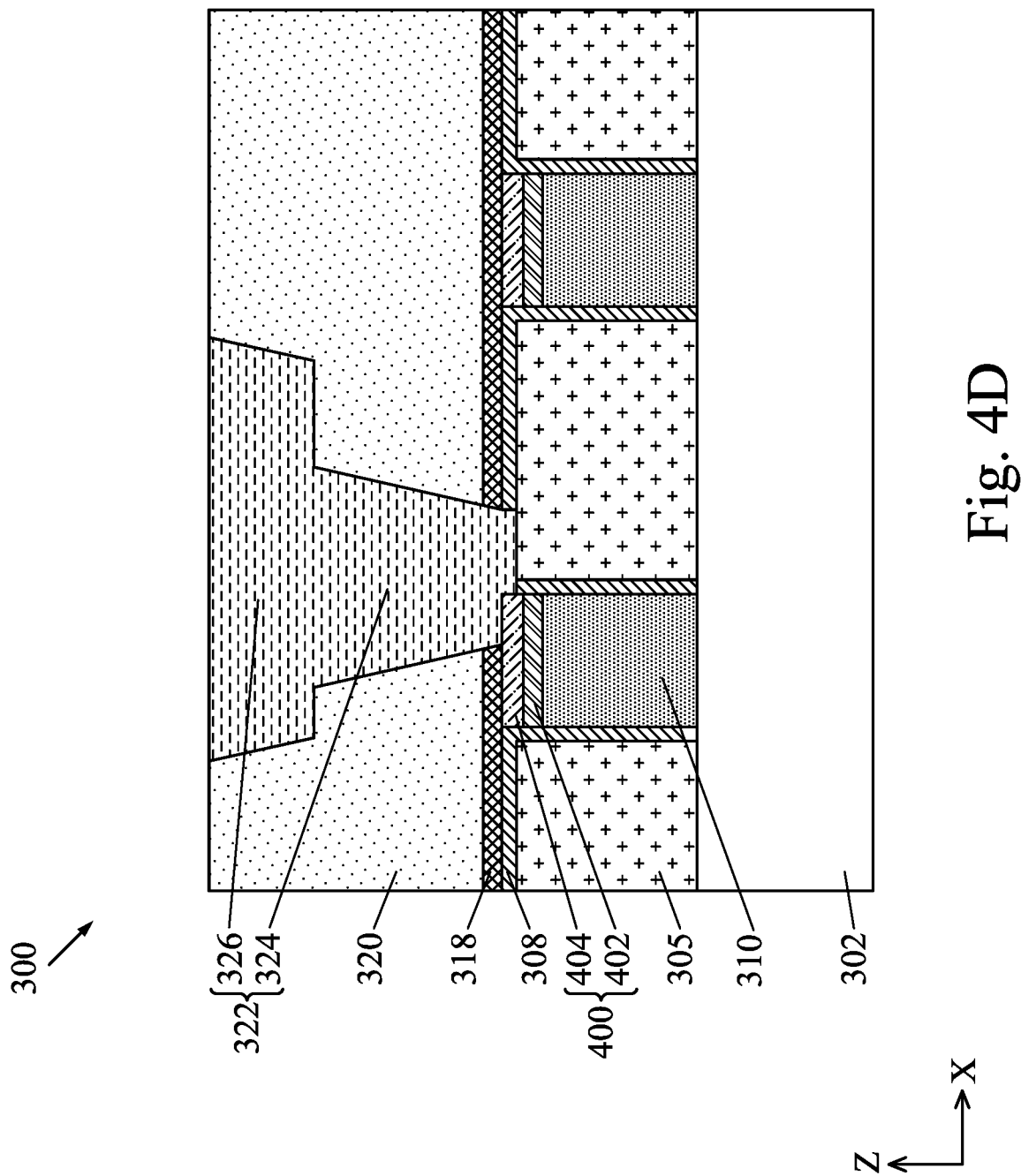

As shown in FIG. 4B, the etch stop layer 318 may be formed on the planar surface. As described above, the planar surface improves yield percent. As shown in FIG. 4C. The dielectric material 320 may be formed on the etch stop layer 318. As shown in FIG. 4D, the conductive features 322 may be formed in the dielectric material 320. In some embodiments, one or more conductive features 322 may not be substantially aligned with the corresponding portions of the conductive layer 305, as shown in FIG. 4D. For example, an opening to expose a portion of the conductive layer 305 may also expose a portion of the dielectric structure 400 as a result of overlay shift. Because the second dielectric layer 404 has a substantially slower etch rate compared to the etch rate of the etch stop layer 318 in the etch process to form the opening, the second dielectric layer 404 may be substantially unaffected by the etchant used to remove a portion of the etch stop layer 318. As a result, the conductive feature 322 formed in the opening does not enter between adjacent portions of the conductive layer 305.

Various embodiments of the present disclosure provide liner 308 formed on portions of the conductive layer 305, so dielectric layers 312 or first and second dielectric layers 402, 404 are selectively formed on the dielectric material 310. The dielectric layers 312 or the first and second dielectric layers 402, 404 have a higher etch selectivity compared to an etch stop layer 318, so the dielectric layers 312 or the first and second dielectric layers 402, 404 are not substantially affected when a portion of the etch stop layer 318 is removed. Some embodiments may achieve advantages. For example, the liner 308 causes the dielectric layers 312 or the first and second dielectric layers 402, 404 to be selectively formed, which reduces the number of processes (i.e., a planarization process and/or etch back process may be omitted as the result of selective deposition). In addition, the dielectric layers 312 or the first and second dielectric layers 402, 404 prevent a conductive feature 322 from forming between the adjacent portions of the conductive layer 305, leading to reduced line to line leakage and reduced capacitance coupling when overlay shift occurs.

An embodiment is an interconnection structure. The structure includes a first conductive feature, a first liner having a first top surface disposed on the first conductive feature, a second conductive feature disposed adjacent the first conductive feature, and a second liner disposed on at least a portion of the second conductive feature. The second liner has a second top surface, and the first liner and the second liner each comprises a two-dimensional material. The structure further includes a first dielectric material disposed between the first and second conductive features and a dielectric layer disposed on the first dielectric material. The dielectric layer has a third top surface, and the first, second, and third top surfaces are substantially co-planar.

Another embodiment is an interconnection structure. The structure includes a first conductive feature, a first liner having a first top surface disposed on the first conductive feature, a second conductive feature disposed adjacent the first conductive feature, a second liner having a second top surface disposed on at least a portion of the second conductive feature, a first dielectric material disposed between the first and second conductive features, a first dielectric layer disposed on the first dielectric material, and a second dielectric layer disposed on the first dielectric layer. The second dielectric layer has a third top surface, and the first, second, and third top surfaces are substantially co-planar. The structure further includes a second dielectric material disposed over the first liner, the second liner, and the second dielectric layer. The structure further includes a third conductive feature disposed in the second dielectric material, and the third conductive feature is in contact with at least a portion of the second conductive feature.

A further embodiment is a method. The method includes forming a conductive layer over a layer, forming one or more openings in the conductive layer to form one or more conductive features and to expose portions of the layer, forming a liner on each of the one or more conductive features, selectively forming a first dielectric material in the openings, and selectively forming a first dielectric layer over each first dielectric material. A top surface of the first dielectric layer is substantially co-planar with a top surface of the liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a conductive layer over a layer;
   forming one or more openings in the conductive layer to form one or more conductive features and to expose portions of the layer;
   forming a liner on each of the one or more conductive features;
   selectively forming a first dielectric material in the openings; and
   selectively forming a first dielectric layer over each first dielectric material, wherein a top surface of the first dielectric layer is substantially co-planar with a top surface of the liner.

2. The method of claim 1, further comprising forming an etch stop layer on the top surfaces of the first dielectric layer and the liner.

3. The method of claim 2, further comprising forming a second dielectric material on the etch stop layer.

4. The method of claim 3, further comprising removing a portion of the second dielectric material, a portion of the etch stop layer, and a portion of the liner to expose at least a portion of one of the one or more conductive features.

5. The method of claim 4, further comprising forming a conductive feature in the second dielectric material, wherein the conductive feature is in contact with the exposed portion of the one of the one or more conductive features.

6. The method of claim 1, further comprising forming a second dielectric layer on each first dielectric material, wherein the first dielectric layer is formed on the second dielectric layer.

7. A method, comprising:
   forming a conductive layer over a substrate;
   removing portions of the conductive layer to form a first conductive feature;
   selectively depositing a liner on the first conductive feature, wherein the liner comprises a two-dimensional material;
   depositing a first dielectric material adjacent the first conductive feature, wherein the first dielectric material has a thickness less than a combined thickness of the liner and the first conductive feature;
   depositing a dielectric layer on and in contact with the first dielectric material; and
   depositing an etch stop layer on and in contact with the liner and the dielectric layer.

8. The method of claim 7, wherein the liner is deposited by a metal-catalyzed process, and the metal-catalyzed process deposits the liner on metallic surfaces of the conductive feature but not on dielectric surfaces.

9. The method of claim 7, wherein the first dielectric material is deposited by thermal soaking in a bottom-up fashion.

10. The method of claim 7, wherein the dielectric layer is deposited by a thermal atomic layer deposition process.

11. The method of claim 10, wherein a process temperature of the thermal atomic layer deposition process ranges from about 150 degrees Celsius to about 350 degrees Celsius.

12. The method of claim 7, wherein the etch stop layer has a substantially flat top surface.

13. The method of claim 12, further comprising depositing a second dielectric material on the etch stop layer.

14. The method of claim 13, further comprising forming a second conductive feature in the second dielectric material and the etch stop layer.

15. The method of claim 14, wherein the second conductive feature is in contact with the dielectric layer and the first conductive feature.

16. A method, comprising:
   forming a conductive layer over a substrate;
   removing portions of the conductive layer to form a first conductive feature;
   depositing a liner on the first conductive feature;
   depositing a first dielectric material adjacent the first conductive feature, wherein the liner is located between the first conductive feature and the first dielectric material;
   depositing a first dielectric layer on and in contact with the first dielectric material;
   depositing a second dielectric layer on and in contact with the first dielectric layer; and
   depositing an etch stop layer on and in contact with the liner and the second dielectric layer.

17. The method of claim 16, wherein the first dielectric material is deposited by thermal soaking in a bottom-up fashion.

18. The method of claim 16, wherein the first dielectric material has a thickness less than a combined thickness of the liner and the first conductive feature.

19. The method of claim 16, further comprising forming a second conductive feature in the second dielectric material and the etch stop layer.

20. The method of claim 19, wherein the second conductive feature is in contact with the second dielectric layer and the first conductive feature.

* * * * *